(12) United States Patent
Wang et al.

(10) Patent No.: US 7,629,227 B1
(45) Date of Patent: Dec. 8, 2009

(54) CVD FLOWABLE GAP FILL

(75) Inventors: Feng Wang, Fremont, CA (US); Victor Y. Lu, Santa Cruz, CA (US); Brian Lu, Fremont, CA (US); Wai-Fan Yau, Los Altos, CA (US); Nerissa Draeger, Milpitas, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/925,514

(22) Filed: Oct. 26, 2007

Related U.S. Application Data

(60) Provisional application No. 60/856,193, filed on Nov. 1, 2006.

(51) Int. Cl.
*H01L 21/76* (2006.01)
(52) U.S. Cl. .............................. 438/452; 257/E21.559
(58) Field of Classification Search ................. 438/400, 438/452; 257/E21.546, E21.553, E21.559
See application file for complete search history.

(56) References Cited

U.S. PATENT DOCUMENTS

| | | | |
|---|---|---|---|
| 4,740,480 A | 4/1988 | Ooka | |
| 5,320,983 A | 6/1994 | Ouellet | |
| 5,516,721 A | 5/1996 | Galli et al. | |
| 5,858,880 A | 1/1999 | Dobson et al. | |
| 5,874,367 A | 2/1999 | Dobson | |
| 5,899,751 A | 5/1999 | Chang et al. | |
| 5,902,127 A | 5/1999 | Park | |
| 5,932,289 A | 8/1999 | Dobson et al. | |
| 6,143,626 A | 11/2000 | Yabu et al. | |
| 6,218,268 B1 | 4/2001 | Xia et al. | |
| 6,242,366 B1 | 6/2001 | Beekman et al. | |
| 6,287,989 B1 | 9/2001 | Dobson | |
| 6,300,219 B1 | 10/2001 | Doan et al. | |
| 6,383,951 B1 | 5/2002 | Li | |
| 6,413,583 B1 | 7/2002 | Moghadam et al. | |
| 6,475,564 B1 | 11/2002 | Carter et al. | |
| 6,544,858 B1 | 4/2003 | Beekman et al. | |
| 6,640,840 B1 | 11/2003 | MacNeil | |
| 6,653,247 B2 | 11/2003 | MacNeil | |

(Continued)

OTHER PUBLICATIONS

U.S. Office Action mailed Aug. 23, 2005, from U.S. Appl. No. 10/810,066.

(Continued)

*Primary Examiner*—W. David Coleman
(74) *Attorney, Agent, or Firm*—Weaver Austin Villeneuve & Sampson LLP

(57) ABSTRACT

Methods of lining and/or filling gaps on a substrate by creating flowable silicon oxide-containing films are provided. The methods involve introducing vapor-phase silicon-containing precursor and oxidant reactants into a reaction chamber containing the substrate under conditions such that a condensed flowable film is formed on the substrate. The flowable film at least partially fills gaps on the substrates and is then converted into a silicon oxide film. In certain embodiments, the methods involve using a catalyst, e.g., a nucleophile or onium catalyst, in the formation of the film. The catalyst may be incorporated into one of the reactants and/or introduced as a separate reactant. Also provided are methods of converting the flowable film to a solid dielectric film. The methods of this invention may be used to line or fill high aspect ratio gaps, including gaps having aspect ratios ranging from 3:1 to 10:1.

23 Claims, 7 Drawing Sheets

U.S. PATENT DOCUMENTS

| | | | |
|---|---|---|---|
| 6,790,737 | B2 | 9/2004 | Schneegans et al. |
| 6,828,162 | B1 | 12/2004 | Halliyal et al. |
| 6,846,757 | B2 | 1/2005 | MacNeil |
| 6,984,561 | B2 | 1/2006 | Herner et al. |
| 7,074,690 | B1 | 7/2006 | Gauri et al. |
| 2002/0006729 | A1 | 1/2002 | Geiger et al. |
| 2003/0146416 | A1* | 8/2003 | Takei et al. ............... 252/500 |
| 2004/0048455 | A1 | 3/2004 | Karasawa et al. |
| 2004/0152342 | A1 | 8/2004 | Li et al. |
| 2007/0281495 | A1* | 12/2007 | Mallick et al. ............ 438/778 |

OTHER PUBLICATIONS

Lang et al., "CVD Flowable Gap Fill," Novellus Systems, Inc., U.S. Appl. No. 11/323,812, filed Dec. 29, 2005, pp. 1-21.

Notice of Allowance and Fee Due mailed Feb. 15, 2006 from U.S. Appl. No. 10/810,066.

Allowed Claims from U.S. Appl. No. 10/810,066.

Gauri et al., "Flowable Film Dielectric Gap Fill Process," Novellus Systems, Inc., U.S. Appl. No. 11/447,594, filed Jun. 5, 2006.

U.S. Office Action mailed Jun. 27, 2008, from U.S. Appl. No. 11/447,594.

U.S. Office Action mailed Oct. 26, 2007, from U.S. Appl. No. 11/323,812.

U.S. Office Action mailed Apr. 9, 2008, from U.S. Appl. No. 11/323,812.

U.S. Office Action mailed Oct. 9, 2008, from U.S. Appl. No. 11/323,812.

Wang, et al., "Density Gradient-Free Gap Fill," Novellus Systems, Inc., U.S. Appl. No. 11/834,581, filed Aug. 6, 2007.

Notice of Allowance and Fee Due mailed Feb. 15, 2006 from U.S. Appl. No. 11/447,594.

Allowed Claims from U.S. Appl. No. 11/447,594.

U.S. Office Action mailed Nov. 12, 2008, from U.S. Appl. No. 11/834,581.

Antonelli et al., "PECVD Flowable Dielectric Gap Fill," Novellus Systems, Inc., U.S. Appl. No. 12/334,726, filed Dec. 15, 2008.

* cited by examiner

US 7,629,227 B1

CVD FLOWABLE GAP FILL

CROSS-REFERENCE TO RELATED APPLICATIONS

This application claims benefit under 35 U.S.C. §119(e) to U.S. Provisional Application No. 60/856,193, filed Nov. 1, 2006, which is incorporated by reference herein.

BACKGROUND OF THE INVENTION

This invention relates to electronic device fabrication processes. More specifically, the invention relates to chemical vapor deposition processes for forming dielectric layers in high aspect ratio, narrow width recessed features.

It is often necessary in semiconductor processing to fill or line a high aspect ratio gaps with insulating material. This is the case for shallow trench isolation, inter-metal dielectric layers, passivation layers, etc. As device geometries shrink and thermal budgets are reduced, void-free filling or uniform lining without significant necking of high aspect ratio spaces (e.g., AR>3:1) becomes increasingly difficult due to limitations of existing deposition processes.

Most deposition methods deposit more material on the upper region than on the lower region of a sidewall and/or create overhang formations at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. One such problematic reentrant feature is a narrowing at the top of the gap. The etched sidewalls slope inward near the top of the gap and for a given aspect ratio feature, this increases the ratio of gap volume to gap access area seen by the precursor species during deposition. Void and seam formation is more likely under these conditions. If the top of the gap prematurely closes off, a chemical etch is required to re-open the gap before more film can be deposited in the gap.

One approach to gap fill is high-density plasma chemical vapor deposition (HDP CVD). HDP CVD is a directional (bottom-up) CVD process that is used for high aspect ratio gap-fill. The method deposits more material at the bottom of a high aspect ratio structure than on its sidewalls. It accomplishes this by directing charged dielectric precursor species downward, to the bottom of the gap. Nevertheless, some overhang or top-hat formation still results at the entry region of the gap to be filled. This results from the non-directional deposition reactions of neutral species in the plasma reactor and from sputtering/redeposition processes. The directional aspect of the deposition process produces some high momentum charged species that sputter away bottom fill. The sputtered material tends to redeposit on the sidewalls. Limitations due to overhang formation become ever more severe as the width of the gap to be filled decreases and the aspect ratio increases.

HDP CVD processes rely on plasma etch steps to remove sidewall deposits and top-hats. Typically a fluorine species, such as $NF_3$, is used between dielectric film deposition steps to etch the film. After a layer of dielectric partially fills gaps on a substrate, the fluorine-containing plasma etches the layer to remove top-hats and open the gap for further deposition. However, these etch steps may be inappropriate in some applications.

Alternative dielectric deposition processes that can fill high aspect ratio features of narrow width, reduce sidewall and top-hat formation and eliminate or reduce the need for etch steps during dielectric deposition would be desirable.

SUMMARY OF THE INVENTION

The present invention provides methods of lining and/or filling gaps on a substrate by creating flowable silicon oxide-containing films. The methods involve introducing vapor-phase silicon-containing precursor and oxidant reactants into a reaction chamber containing the substrate under conditions such that a condensed flowable film is formed on the substrate. The flowable film at least partially fills gaps on the substrate and is then converted into a silicon oxide film. In certain embodiments, the methods involve using a catalyst, e.g., a nucleophile or onium catalyst, in the formation of the film. The catalyst may be incorporated into one of the reactants and/or introduced as a separate reactant. Also provided are methods of converting the flowable film to a solid dielectric film. The methods of this invention may be used to line or fill high aspect ratio gaps, including gaps having aspect ratios ranging from 3:1 to 10:1.

DETAILED DESCRIPTION OF THE INVENTION

Introduction

The present invention relates to deposition processes that provide gap fill of high aspect ratio (typically at least 3:1), narrow width gaps. Most deposition methods either deposit more material on the upper region than on the lower region of a sidewall or form cusps (also called top-hats) at the entry of the gap. To remove sidewall and top-hat deposits and keep the gap open for further deposition, conventional HDP CVD processes typically use a multi-cycle deposition process—etch process.

Figure 1:
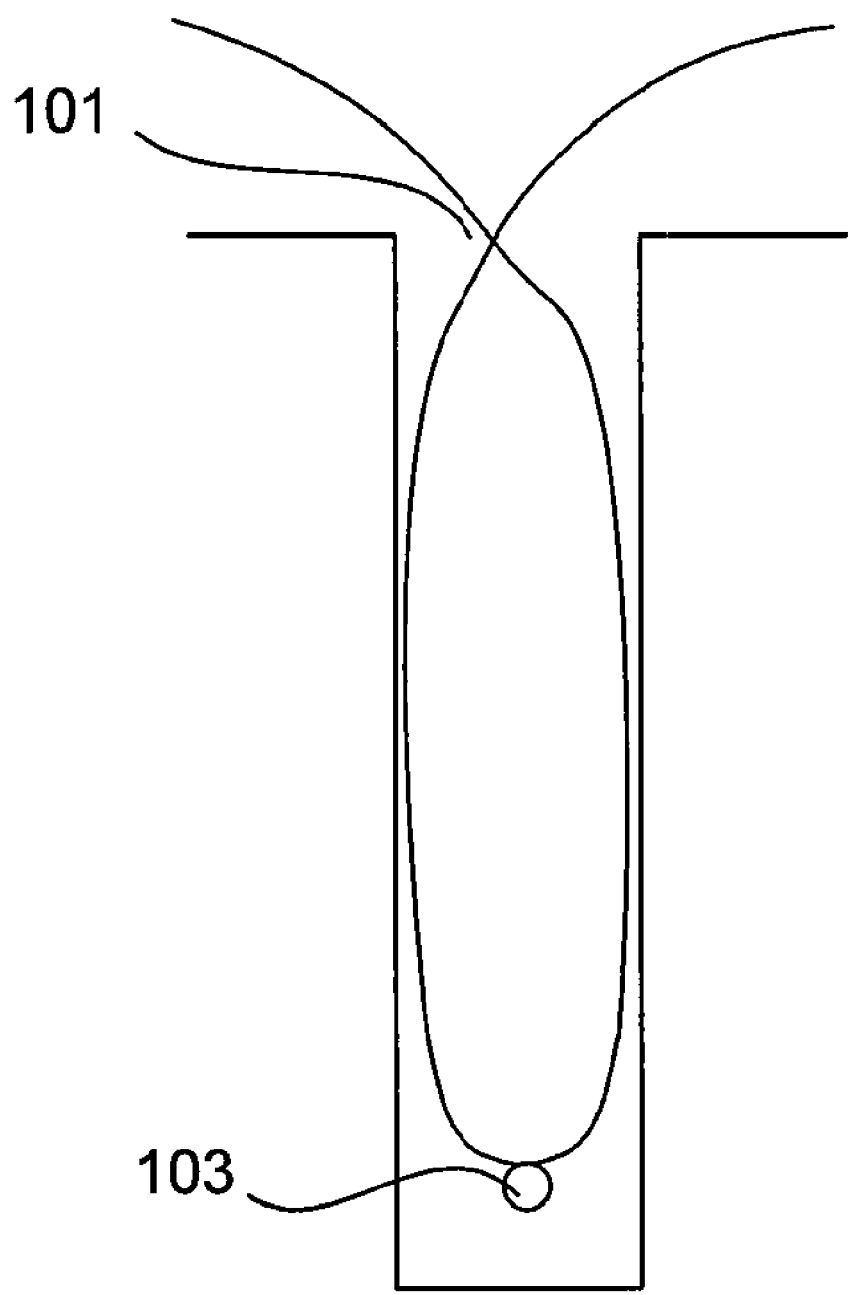
FIG. 1 is a rough schematic cross-sectional diagram of a trench partially filled by a conventional method.

FIG. 1 shows a rough schematic of a trench partially filled by a conventional deposition-only process. Reference number 101 indicates where sidewalls have formed from film that has been sputtered away from the bottom of the trench and redeposited on the sidewalls of the trench. These sidewalls have pinched off preventing further deposition. A chemical and/or sputter etch is required to re-open the trench before dielectric film can be deposited in it. Multiple deposition-etch-deposition cycles are necessary to fill high aspect ratio trenches or other features. Reference number 103 indicates a weak spot. Conventional gap fill methods often lead to the formation of weak spots in the dielectric film. Weak spots may form as a result of the increased gap volume to gap access area as the gap closes off, and can lead to voids or seams in the gap and ultimately device failure.

Conformal deposition processes, e.g., pulsed deposition layer (PDL) or atomic layer deposition (ALD), are able to fill gaps with vertical sidewalls. However, they may also result in voids or seams in gaps with reentrant features.

The present invention provides single-cycle and multi-cycle methods that result in good, seamless and void-free gap fill. The methods provide lined or partially or wholly filled gaps without overhang or top-hat formation. The methods involve depositing a soft jelly-like liquid or flowable film and then converting the flowable film into a solid silicon oxide film. The methods of the present invention enable gap fill in reduced sized features with high aspect ratios and/or may reduce or eliminate the need for etch steps.

Process

Figure 2:
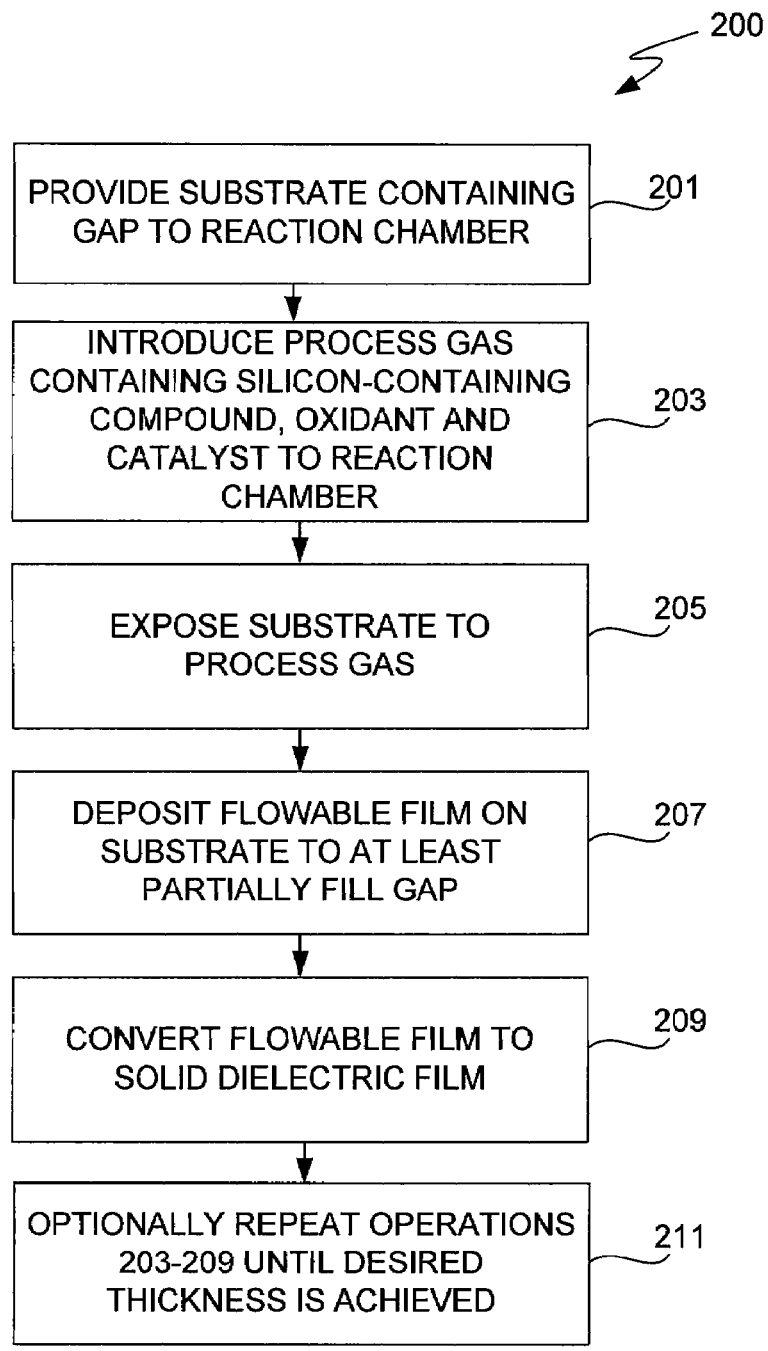
FIG. 2 is a process flow diagram depicting a method of filling a gap on a substrate according to one embodiment of the invention.

FIG. 2 is a process flow sheet depicting a method according to one embodiment of the present invention. As shown, a deposition process 200 begins at an operation 201 in which a substrate containing a gap is provided to a reaction chamber. Providing the substrate to the reactor may involve clamping the substrate to a pedestal or other support in the chamber. For this purpose, an electrostatic, vacuum or mechanical chuck may be employed.

After the substrate is provided to the reaction chamber, process gases are introduced at an operation 203. The process gas reactants include a silicon-containing compound, an oxidant and a catalyst. The gases may also include one or more dopant precursors, e.g., a fluorine, phosphorous and/or boron-containing gas. Sometimes, though not necessarily, an inert carrier gas is present. In certain embodiments, the gases are introduced using a liquid injection system. Typically the silicon-containing compound and the oxidant are introduced via separate inlets or are combined just prior to introduction into the reactor in a mixing bowl and/or showerhead. As discussed further below, the catalyst and/or optional dopant may be incorporated into one of the reactants, pre-mixed with one of the reactants or introduced as a separate reactant. The substrate is then exposed to the process gases at an operation 205. Conditions in the reactor are such that the silicon-containing compound and the oxidant react to form a condensed flowable film on the substrate. Formation of the film is aided by presence of the catalyst. The method is not limited to a particular reaction mechanism, e.g., the reaction mechanism may involve a condensation reaction, a vapor-phase reaction producing a vapor-phase product that condenses, condensation of one or more of the reactants prior to reaction, or a combination of these. As shown in an operation 207, a flowable film is thereby deposited on the substrate surface. The substrate is exposed to the process gases for a period sufficient to deposit a flowable film to fill at least some of the gap. The deposition process typically forms soft jelly-like film with good flow characteristics, providing consistent fill. The deposited film may also be described herein for the purposes of discussion as a gel having liquid flow characteristics, a liquid film or a flowable film.

Process conditions in the reactor are such that the reaction product condenses on the surface. In certain embodiments, this involves bringing the substrate into the chamber under "dark", i.e., non-plasma conditions, i.e., the substrate is not exposed to a plasma during the deposition phase (operations 205 and 207) of the process. In other embodiments, a plasma may be used. Although not indicated on the flow sheet, gaseous byproducts or excess reactants may be continuously pumped from the reaction chamber.

After the flowable film has been deposited on the substrate, the as-deposited flowable film is converted to a silicon oxide dielectric film in an operation 209. According to various embodiments, this conversion may involve a thermal, ultraviolet (UV), electron-beam (E-beam), microwave, laser or plasma anneal. Film conversion is discussed further below.

In certain embodiments, the gap may be filled or the desired amount of film may be formed in a single cycle. In other embodiments, the deposition and conversion processes are repeated as necessary to fill the gap or deposit the desired amount of film (e.g., line, partially fill, or wholly fill the gap). Thickness of film deposited in a single cycle may range from about 10 nm to a complete fill and in particular examples from about 30 nm to 100 nm. In certain embodiments, it may be useful to use multiple cycles to more easily achieve gap fill, e.g., in narrow trenches, without gradients in density, film composition, dielectric constant, refractive index, and/or mechanical properties. These gradients may occur if the conversion process does not equally affect the film at all thicknesses.

Process Parameters

Process Gas

The process gases include a silicon-containing compound, an oxidant and, in certain embodiments, a catalyst. Suitable silicon-containing compounds include organo-silanes and organo-siloxanes. In certain embodiments, the silicon-containing compound is a commonly available liquid phase silicon source. In some embodiments, a silicon-containing compound having one or more mono, di, or tri-ethoxy, methoxy or butoxy functional groups is used. Examples include, but are not limited to, tetraoxymethylcyclotetrasiloxane (TOMCTS), octamethylcyclotetrasiloxane (OMCTS), tetraethoxysilane (TEOS), triethoxysilane (TES), trimethoxysilane (TMS or TriMOS), methyltriethoxyorthosilicate (MTEOS), tetramethylorthosilicate (TMOS), methyltrimethoxysilane (MT-MOS), dimethyldimethoxysilane (DMDMOS), diethoxysilane (DES), triphenylethoxysilane, 1-(triethoxysilyl)-2-(diethoxymethylsilyl)ethane, tri-t-butoxylsilanol and tetramethoxy silane.

In certain embodiments, the silicon-containing precursor is an alkoxysilane that may be described by the following:

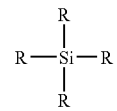

wherein at least 2 of the R groups are independently $C_1$-$C_5$ alkoxy groups (or other organic groups that can be readily cleaved from silicon at temperatures near room temperature by hydrolysis), and the balance, if any, are independently selected from the group consisting of hydrogen, alkyl, alkenyl and alkynyl groups, substituted and unsubstituted phenyl, halogen and amine. The alkoxy R groups include ethylene glycoxy, propylene glycoxy and the like. In particular embodiments, all four R groups are independently selected from methoxy, ethoxy, propoxy and butoxy, e.g., tetraethoxysilane (TEOS). Examples of other alkoxysilanes that are used in particular embodiments are trimethoxysilane $SiH(OMe)_3$, triacetoxysilane $SiH(OAc)_3$, tetraacetoxysilane $Si(OAc)_4$ and triethoxysilane $SiH(OEt)_3$.

In certain embodiments, the precursor contains multiple alkylsilane or alkoxysilane groups that form linear, branched or cyclic organosilicon compounds. An example is:

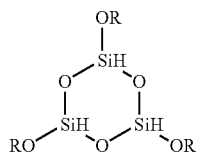

The oxidant may be any suitable oxidant capable of reacting with the silicon precursor to form the flowable film. Examples of suitable oxidants include ozone, hydrogen peroxide and water (steam). In certain embodiments, the oxidant is a non-peroxide oxidant. As described further below, the oxidant in some embodiments, may be premixed with a catalyst, e.g., an ammonia hydroxide solution may provide both the oxidant and the catalyst.

In some embodiments, the silicon-containing compound and the oxidant are delivered to the reaction chamber via liquid injection system that vaporizes the liquid for introduction to the chamber. The reactants are typically delivered separately to the chamber or are combined just prior to introduction into the chamber in a mixing bowl and/or showerhead. Typical flow rates of the liquid introduced into a liquid injection system range from 0.01-10.0 mL/min per reactant. Of course, one of skill in the art will understand that optimal flow rates depend on the particular reactants, desired deposition rate, reaction rate and other process conditions.

Acceptable silicon-containing compound/oxidant flow ratios are very variable with examples of suitable ratios including from about 10:1-1:100.

The flowable film deposited on the substrate typically contains some combination of Si—O, Si—H and Si—OH bonds. Process conditions prevent significant incorporation of organic groups in the film. For example, in reaction between TES and steam, the chemical reaction causes formation of a flowable film containing Si—OH, Si—H and Si—O bonds, while the ethoxy group is removed as a gaseous ethanol byproduct. As discussed above with respect to FIG. 1, the byproduct and/or excess reactants may be continuously pumped out.

Film composition depends in part on the oxidant chosen, with a weaker oxidant (e.g., water) resulting in more Si—H bonds than a stronger oxidant (e.g., ozone). Using ozone will result in conversion of most of the Si—H bonds to Si—OH bonds.

Water is used to form Si—O bonds in many embodiments. In particular embodiments, $H_2O$ (steam) or aqueous solutions are used as the oxidant. One reaction is the TES+$H_2O$. It is believed that the following reaction takes place to form the condensed Si—OH and Si—H containing film:

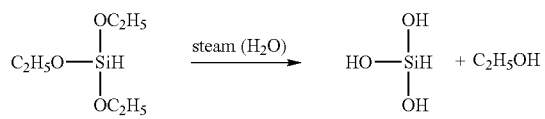

Although not indicated in the reaction scheme, a catalyst is used in many embodiments of the invention to aid in the formation of the condensed flowable film.

Catalyst

In many embodiments, the process gases include a catalyst that catalyzes the formation of the flowable film on the substrate. The catalytic compounds that are used in the methods of the invention are vaporizable and easily dissociate or ionize to form an ionic species that catalyzes the formation of the flowable film. Without being bound by a particular theory, it is believed that the anions or cations catalyze the formation of the flowable film by one or more of the following mechanisms: the catalyst wets the substrate surface, making it easier for the reactants or products to condense on or wet the surface; the catalyst changes the pH to one that favors hydrolysis and/or bond formation (e.g., crosslinking); the catalyst affects the vapor-phase reaction; and the catalyst induces bond formation and/or cross-linking in the flowable film. According to various embodiments, the use of the catalyst aids film deposition, e.g., by improving crosslinking and reaction rate, and/or substrate coverage. Catalyst-free deposition has been observed in some cases to result in the formation of islands on the surface of the substrate, believed to be caused by the high mobility of reaction intermediates. In certain embodiments, the catalyst may aid full wafer coverage by increasing the rate of hydrolosis and thereby reducing the surface mobility of reaction intermediates.

Catalysts that may be used in the methods of the invention include nucleophiles, e,g., halogens ($F^-$, $Cl^-$ and $Br^-$, etc.) as well as oniums, e.g. ammonium ($NH_4^+$) and phosphonium ($PH_4^+$). Onium species that may be used include $NH_4OH$, $NH_4OAc$, $NH_3$, $(CH_3)_4NOH$, $(CH_3)_4NOAc$, $PH_3$, or any other compound that is vaporizable and readily disassociated or ionized to produce the desired ion.

In certain embodiments, the catalyst compound is a Si-containing catalyst compound, with the catalyst formed by in-situ hydrolysis that leads to the release of the active species. Si-containing catalyst compounds include $R_3SiX$ where the R groups are independently selected from H, $C_1$-$C_5$ alkyl or alkoxy and X is a halogen, amine, or phosphine. Specific examples include $(CH_3)_3SiCl$, $(CH_3CH_2O)_3SiCl$, $(CH_3O)_2Si(H)Cl$, $(CH_3CH_2O)_2Si(H)Cl$ and $(CH_3)_3SiN(H)Si(CH_3)_3$ These Si- containing catalyst compounds may also provide at least some of the silicon that reacts to form the flowable film and/or be mixed with the silicon-containing precursor. For example, in one embodiment, a trimethoxysilane ($(CH_3O)_3SiH$) precursor with a certain percentage of $Cl^-$ impurity (in the form of $(CH_3O)_2Si(H)Cl$) is used. A silicon-containing catalyst compound is not limited to use with its 'pure' form but may also be used with another silicon-containing precursor (e.g.$(CH_3O)_3SiCl$) may be the catalyst compound and TEOS the precursor). As indicated above, silicon-containing precursor and catalyst compounds may either introduced together or as separate reactants. Other silicon-containing compounds may also be used, including those of the form $HSiCl_3$ or $SiCl_4$.

As indicated above, the catalyst compound is not limited to silicon-containing compounds but may be any vaporizable compound that is readily dissociated or ionized to form the desired ionic species. In embodiments wherein the catalyst is a halogen ion, the catalyst may be introduced as chlorine gas, bromine gas, fluorine gas, hydrogen bromide, hydrogen chloride, etc., or other halogen-containing gas. As indicated above, various onium species are also used. These compounds are may be delivered to the reactor as a third reactant, or in certain embodiments, if the onium ion is inert to the silicon precursor in the absence of water, the onium catalyst may be pre-mixed with the silicon precursor. Likewise, the onium catalyst may be pre-mixed with water or other oxidant if it does not get de-activated.

The catalyst may be a metal ion or a non-metal ion. Examples of metal ions include sodium and potassium ions, while examples of non-metal ions are given above. Non-metal ions are preferred for semiconductor applications, but metal ions may be appropriate for other applications, such as in the manufacturing of flat-panel displays.

Also, as indicated, in certain embodiments, the catalyst is introduced with the oxidant, e.g., as an ammonium hydroxide solution. The catalyst compound may be introduced to the reactor via a separate inlet or are combined with one or more of the reactants just prior to introduction into the reactor, e.g, in a mixing bowl and/or showerhead.

Deposition Reaction Conditions

Reactions conditions are such that the silicon-containing compound and oxidant undergo a reaction to form a condensed flowable film on the substrate surface.

As discussed above, the reaction mechanism may involve a condensation reaction, a vapor-phase reaction producing a vapor-phase product that condenses, condensation of one or more of the reactants prior to reaction, or a combination of these. In certain embodiments, the reaction takes place in dark or non-plasma conditions.

Chamber pressure may be between about 1-100 Torr, in certain embodiments, it is between 2 and 50 Torr. Lower pressures typically result in slower deposition rates.

Substrate temperature is typically between about −20 and 100 C. In certain embodiments, temperature is between about 0 and 35 C. Pressure and temperature may be varied to adjust deposition time. In one embodiment, the temperature is about 5 C and the pressure about 10 Torr.

Exposure time depends on reaction conditions as well as the desired film thickness. Deposition rates are typically from about 100 angstroms/min to 1 micrometer/min.

Typically the silicon-containing compound and the oxidant are introduced via separate inlets or are combined just prior to introduction into the reactor. They may be delivered to the reactor through a showerhead, a dual-plenum showerhead, baffle plate, gas ring, injection tubes, or other means. Showerhead (or other gas inlet) to pedestal distance should also be small to facilitate deposition. Showerhead-pedestal distance typically ranges from about 100 mil-5 inches. In some embodiments, it ranges from about 200 mil-3 inches.

In addition, to pressure and temperature, reactant flow rates may be adjusted to vary deposition rate and film characteristics. Examples of precursor and oxidant flowrates are given above; as indicated a broad range of silicon-containing precursor:oxidant flow rate ratios typically may be used. The amount of catalyst used should be enough to adequately catalyze the reaction. In an example, an ammonia hydroxide solution (~0.05%) is used in place of water. In another example, the Cl⁻ content of a silicon-containing precursor is about 0.4%.

Figure 7:
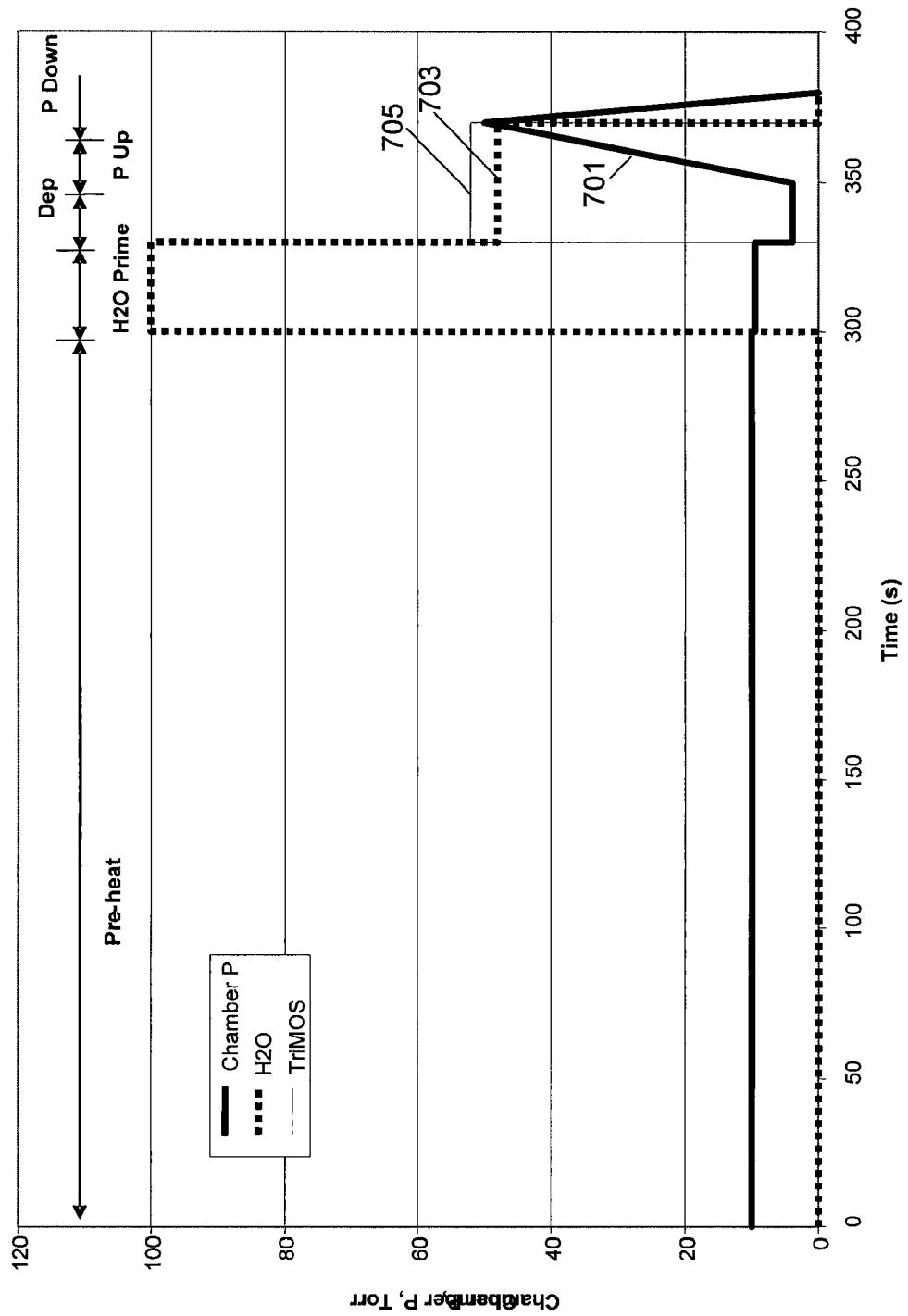
FIG. 7 is graph depicting pressure and silicon precursor and oxidant flow rates as a function of time in a deposition process in accordance with certain embodiments of the invention.

In certain embodiments, the chamber pressure is ramped up during the deposition. FIG. 7 shows chamber pressure 701, $H_2O$ flow 703, and trimethoxysilane (TriMOS) flow 705 as a function of time in an example of a deposition process. Chamber pressure is at about 4 Torr at the start of the deposition, and is gradually ramped up to about 50 Torr. Ramping up the pressure in a manner such as shown in FIG. 7 has been shown to provide improved deposition over using constant pressure in certain process schemes. If employed, pressure ramp-up rate typically ranges from about 2.5 Torrs/sec-10 Torr/sec in certain embodiments.

Converting the Flowable Film to a Solid Oxide Film

After the flowable film is deposited on the substrate, it is converted to a solid silicon dioxide film. According to various embodiments, the film may be converted to a solid oxide film by exposure to plasma. It is desirable to achieve a uniform conversion of the flowable film to a solid silicon dioxide film.

Oxygen, helium, argon and steam plasmas are examples of plasmas that may be used. The plasma may also contain one or more of these compounds. Nitrogen-containing plasmas should be avoided if the incorporation of nitrogen in the resulting dielectric film is undesirable. Temperatures during plasma exposure are typically about 20° C. or higher.

In certain embodiments, an oxygen or oxygen-containing plasma is used to facilitate conversion of the Si—H bonds into Si—O bonds. An oxygen-containing plasma may be particularly useful for flowable films that have a high number of Si—H bonds, e.g., for films formed by the reaction of TEOS and steam.

The plasma source may be any known plasma source, including RF and microwave sources. In a RF plasma, plasma power is typically at least about 3000 W. The plasma source may be an inductively coupled (high density) plasma or a capacitively coupled plasma. Also the plasma-assisted conversion is preferably performed with a high frequency substrate bias.

In some embodiments, a thermal anneal may be used instead of or in addition to a plasma to convert the film into a solid oxide. Thermal annealing may be performed in any suitable ambient, such as a water, oxygen, air, carbon dioxide, hydrogen, nitrogen, or inert ambient. In specific embodiments, it is desirable to conduct the thermal anneal in an oxidizing ambient to facilitate conversion of the Si—H bonds into Si—O bonds. Temperatures are typically at least about 25° C., i.e. high enough to break the Si—OH bond. For example, thermally annealing a silanol gel R—Si(OH)$_x$ results in a silicon dioxide $SiO_2$ film and water vapor.

Figure 3:
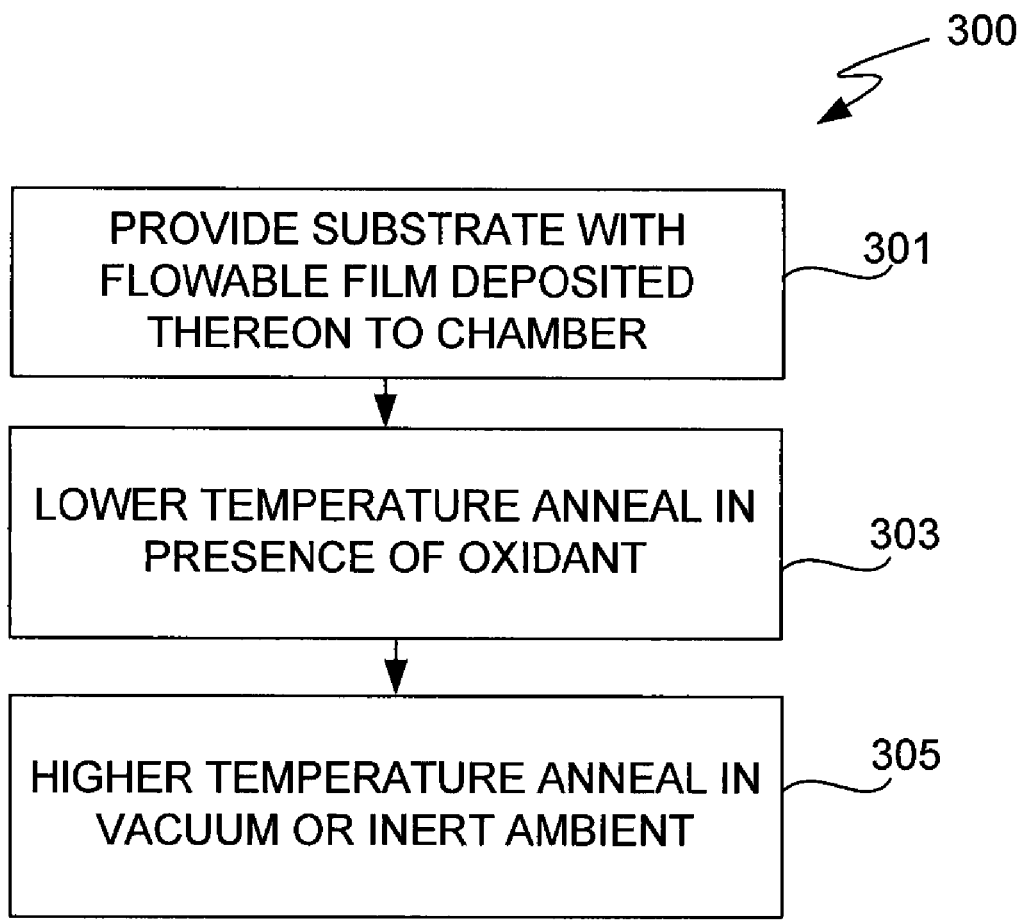
FIG. 3 is a process flow diagram depicting a method of converting a flowable film to a dense solid dielectric film according to one embodiment of the invention.

In certain embodiments, a multi-stage curing or anneal process may be used. For example, a first stage may be used to convert any Si—H to Si—OH and Si—O and a second stage used to improve film quality and convert the film to fully dense oxide (substantially free of Si—H and Si—OH). FIG. 3 shows a multi-stage anneal or cure process according to certain embodiments. The process 300 begins at an operation 301 in which the substrate having the flowable film containing Si—H and Si—OH bonds is provided to a chamber. The chamber may be the same chamber in which the deposition takes place (in which case the substrate remains there) or the substrate may be transferred to a separate chamber after the deposition for the conversion process. At an operation 301, the substrate is cured or annealed at a "lower" temperature in the presence of an oxidant. Lower refers to the temperature relative to the next anneal operation; in certain embodiments the lower temperature is less or equal to about 600 C, e.g., from about 200-600 C. This operation converts most of the Si—H to Si—O, and may also convert Si—H to Si—OH. Suitable oxidants include but are not limited to oxygen gas, steam and air. The use of the lower temperature anneal converts most of the Si—H of the flowable film to Si—O, but does not allow oxidation of the silicon substrate. Then, in an operation 305, the film is annealed or cured at higher temperature in a vacuum or inert (e.g., nitrogen, argon, helium) ambient to convert Si—OH bonds to Si—O, improve film quality and convert the film to a fully dense oxide. Temperatures for this operation are higher than the lower temperature in operation 303, and are typically less than or equal to about 1100° C. (e.g, between about 400 and 1100 C). The use of the multi-stage anneal described above results in density gradient free gap fill.

Other Embodiments

Commonly-assigned U.S. patent application Ser. No. 11/323,812 (hereby incorporated by reference for all purposes) describes a method of forming a flowable film by first depositing the silicon-containing precursor and then flowing steam to convert the film to the flowable liquid. The use of a catalyst as described herein may be used in conjunction with this method, with the catalyst introduced in one of the reactant flows, or as a separate reactant that may be introduced at the same time as either or both reactants.

Also as described in U.S. patent application Ser. No. 11/323,812, an alcohol may be added to the process gas to act as a reaction inhibitor.

Further, while the above description discusses the invention in the context of integrated circuit fabrication, there are numerous applications of the present invention, both inside and outside the integrated circuit fabrication arena.

Apparatus

The methods of the present invention may be performed on a wide-range of reaction chambers. The methods may be implemented on any chamber equipped for deposition of dielectric film, including HDP-CVD reactors, PECVD reactors, any chamber equipped for CVD reactions, and chambers used for PDL (pulsed deposition layers).

Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vertical translation, vibration, or other agitation). While in process, each wafer is held in place by a pedestal, electrostatic chuck, mechanical chuck and/or other wafer holding apparatus. For certain operations in which the wafer is to be heated, the apparatus may include a heater such as a heating plate.

In certain embodiments, the present invention may be implemented in a HDP CVD reactor. An example of a suitable reactor is the Speed™ reactor, available from Novellus Systems of San Jose, Calif. In certain embodiments, the present invention may be implemented in a PECVD reactor. Examples of suitable reactors are the Sequel™ reactor and the Vector™ reactor, both available from Novellus Systems of San Jose, Calif. In certain embodiments, the present invention may be implemented in a CVD chamber equipped for metal and/or dielectric deposition. An example of a suitable reactor is the Altus™ reactor available from Novellus Systems of San Jose, Calif. In certain embodiments, the present invention may be implemented in a chamber equipped for atomic layer deposition (ALD), pulsed depositon layer (PDL), or pulsed nucleation layer (PNL) reactions. Examples of such reactors are the Altus DirectFill™ reactor and the PDL Oxide reactor, both available from Novellus Systems of San Jose, Calif.

In certain embodiments, the deposition and conversion operations are performed in the same reaction chamber. In other embodiments, the deposition and conversion operations are performed on different stations in the same reaction chamber. In other embodiments, the deposition may be performed in a first chamber and then transferred to a second chamber for a thermal, plasma or other type of anneal. For example, reactors that are configured for plasma reactions may be used for both the deposition and plasma anneal operations. Other reactors may be used for deposition and thermal anneal operations.

Figure 4:
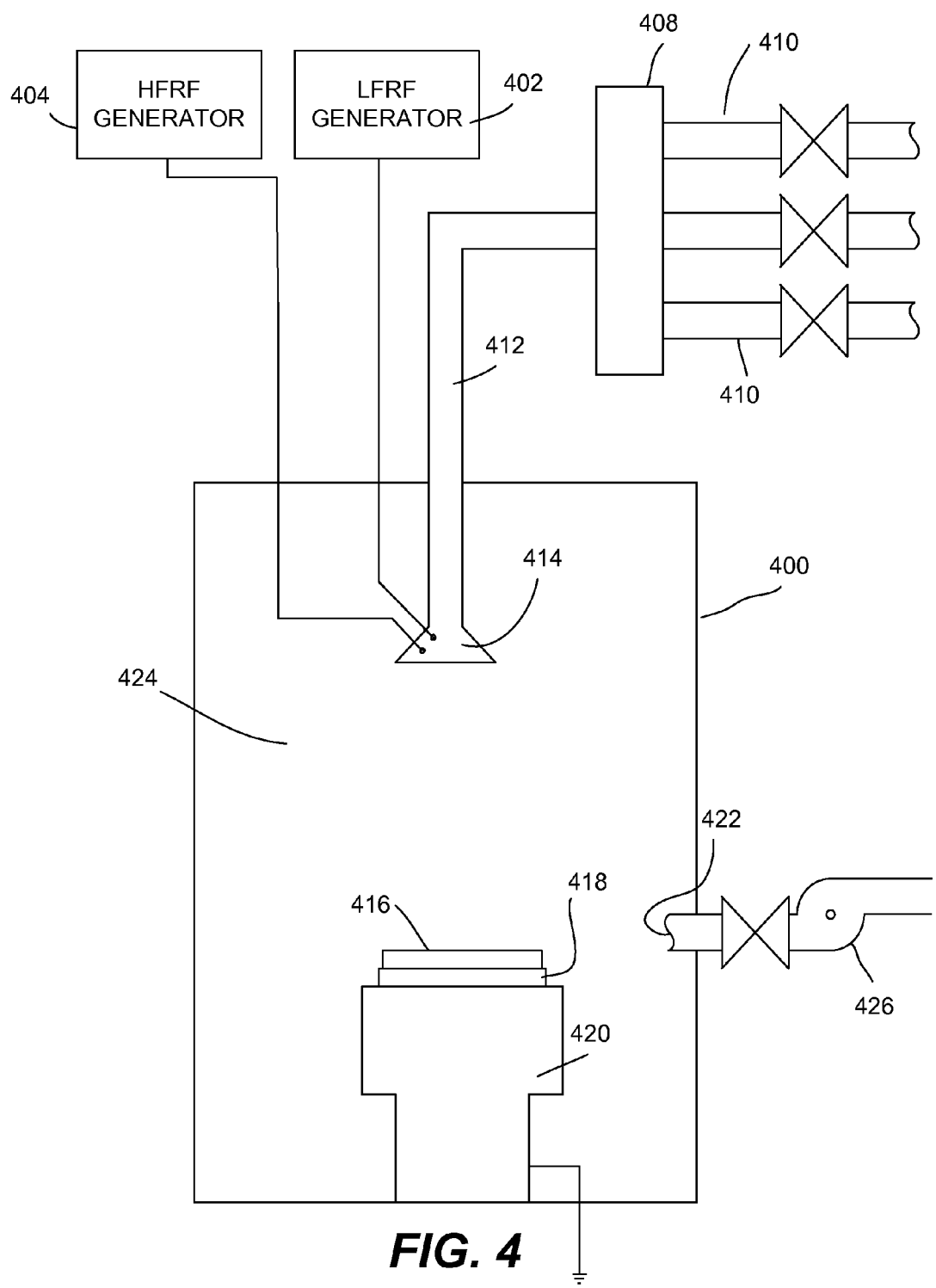
FIGS. 4 and 5 are block diagram depicting some components of various reactors suitable for performing certain embodiments of the invention.

FIG. 4 shows an example of a reactor that may be used in accordance with certain embodiments of the invention. The reactor shown in FIG. 4 is suitable for both the deposition and conversion to a solid film, for example, by plasma anneal. As shown, a reactor 400 includes a process chamber 424, which encloses other components of the reactor and serves to contain the plasma generated by a capacitor type system including a showerhead 414 working in conjunction with a grounded heater block 420. A low-frequency RF generator 402 and a high-frequency RF generator 404 are connected to showerhead 414. The power and frequency are sufficient to generate a plasma from the process gas, for example, 400-700 W total energy for a deposition, and a higher power for a plasma anneal. In one implementation of the present invention, the generators are not used during deposition of the flowable film. During the plasma anneal step, one or both generators may be used. For example, in a typical process, the high frequency RF component is generally between 2-60 MHz; in a preferred embodiment, the component is 13.56 MHz.

Within the reactor, a wafer pedestal 418 supports a substrate 416. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 412. Multiple source gas lines 410 are connected to manifold 408. The gases may be completely premixed, partially premixed or not. Appropriate valving and mass flow control mechanisms are employed to ensure that the correct gases are delivered during the deposition and plasma treatment phases of the process. In case the chemical precursor(s) is delivered in the liquid form, liquid flow control and injection mechanisms are employed. The liquid is then vaporized and mixed with other process gases during its transportation in a manifold heated above its vaporization point before reaching the deposition chamber. The temperature of the mixing bowl/manifold lines should be maintained at levels above the vaporization temperature of the process gases. Temperatures at or above about 80 C at pressures at or less than about 20 Torr usually suffice.

Process gases exit chamber 400 via an outlet 422. A vacuum pump 426 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

It should be noted that the apparatus depicted in FIG. 4 is but one example of an apparatus that may be used to implement this invention.

Figure 5:
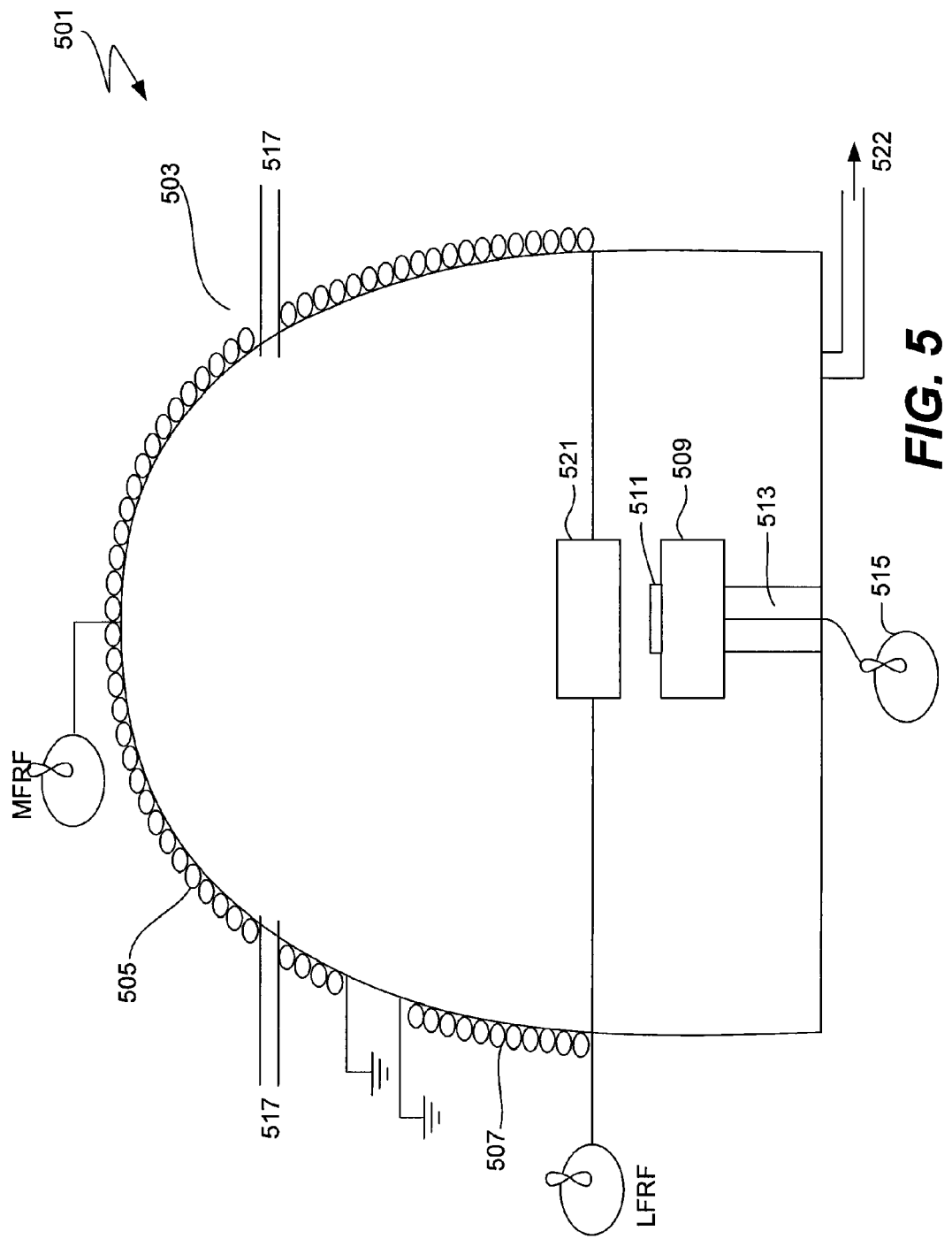

FIG. 5 provides a simple block diagram depicting various reactor components as may be arranged in a HDP-CVD reactor that may be used in accordance with the invention. As shown, a reactor 501 includes a process chamber 503 which encloses other components of the reactor and serves to contain the plasma. In one example, the process chamber walls are made from aluminum, aluminum oxide, and/or other suitable material. The embodiment shown in FIG. 5 has two plasma sources: top RF coil 505 and side RF coil 507. Top RF coil 505 is a medium frequency or MFRF coil and side RF coil 507 is a low frequency or LFRF coil. In the embodiment shown in FIG. 5, MFRF frequency may be from 430-470 kHz and LFRF frequency from 340-370 kHz. However, the invention is not limited to operation in reaction chambers with dual sources, nor RF plasma sources. Any suitable plasma source or sources may be used.

Within the reactor, a wafer pedestal 509 supports a substrate 511. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 513 for supplying heat transfer fluid controls the temperature of substrate 511. The wafer chuck and heat transfer fluid system can facilitate maintaining the appropriate wafer temperatures.

A high frequency RF of HFRF source 515 serves to electrically bias substrate 511 and draw charged precursor species onto the substrate for the deposition reaction. Electrical energy from source 515 is coupled to substrate 511 via an electrode or capacitive coupling, for example. Note that the bias applied to the substrate need not be an RF bias. Other frequencies and DC bias may be used as well.

The process gases are introduced via one or more inlets 517. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 521, which may or may not direct the gases toward the substrate surface. Injectors may be connected to the primary gas ring 521 to direct at least some of the gases or gas mixtures into the chamber and toward substrate. Note that injectors, gas rings or other mechanisms for directing process gas toward the wafer are not critical to this invention. The flow dynamics caused by a process gas entering the chamber will itself cause the gas to disperse in all directions—including toward the substrate. Process gases exit chamber 503 via an outlet 522. A vacuum pump (e.g., a turbomolecular pump) typically draws process gases out and maintains a suitable pressure within the reactor.

In certain embodiments, high-cost features of the Speed™ or other HDP-CVD tool may be eliminated. For example, the present invention may be implemented on a HDP-CVD reactor without a dome and/or turbo-molecular pumps.

As indicated the reactors depicted in FIGS. 4 and 5 are merely exemplary. For example, while FIGS. 4 and 5 provide examples of reactors that may be used to deposit the flowable film and provide inductively or capacitatively coupled plasma for an anneal operation, in certain embodiments wherein non-plasma thermal anneals are performed, the plasma generation mechanisms are not necessary. Also, as described above, the reactants are injected via liquid injectors in many embodiments. In certain embodiments, the CVD reactor may include a baffle assembly to increase reactor residence time and provides uniform delivery of the gases. An example of a baffle plate assembly as used in accordance with the invention is described the above-referenced commonly-assigned U.S. patent application Ser. No. 11/323,812.

EXPERIMENTAL

The following examples provide details illustrating aspects of the present invention. These examples are provided to exemplify and more clearly illustrate these aspects of the invention and are in no way intended to be limiting.

Example 1

Effect of Using Cl⁻ Catalyst

Wafers were exposed to trimethoxysilane (TriMOS) gas and steam at the following conditions:

|  | A | B |
|---|---|---|
| Catalyst Content | 0 | 0.4% Cl (provided as $(CH_3O)_2Si(H)Cl$) |
| TriMOS flow rate | 1.3 mL/min | 1.3 mL/min |
| Steam flow rate | 0.13 mL/min | 0.13 mL/min |
| Pressure | 4-50 torr | 4-50 torr |
| Temperature | 8 C. | 8 C. |
| Exposure Time | 20-60 sec | 20-60 sec |

The wafer was allowed to cool to 8° C. with a constant flow of He at 2 SLM before exposing to steam (1.00 mL/min) over a period of 10 s. The wafer is then exposed to TriMOS (1.30 mL/min) and steam (0.13 mL/min) for a period of 45 s during which time the He-carrier gas was flowing at 2 SLM. Pressures were varied during the process.

No deposition was observed for "A." For "B," full, continuous-color wafer coverage of film was observed. Film thickness was observed to be fairly uniform, with most of the wafer having about 100 nm of film.

Example 2

Effect of Thermal Cure Budget on Film Structure

Figure 6:
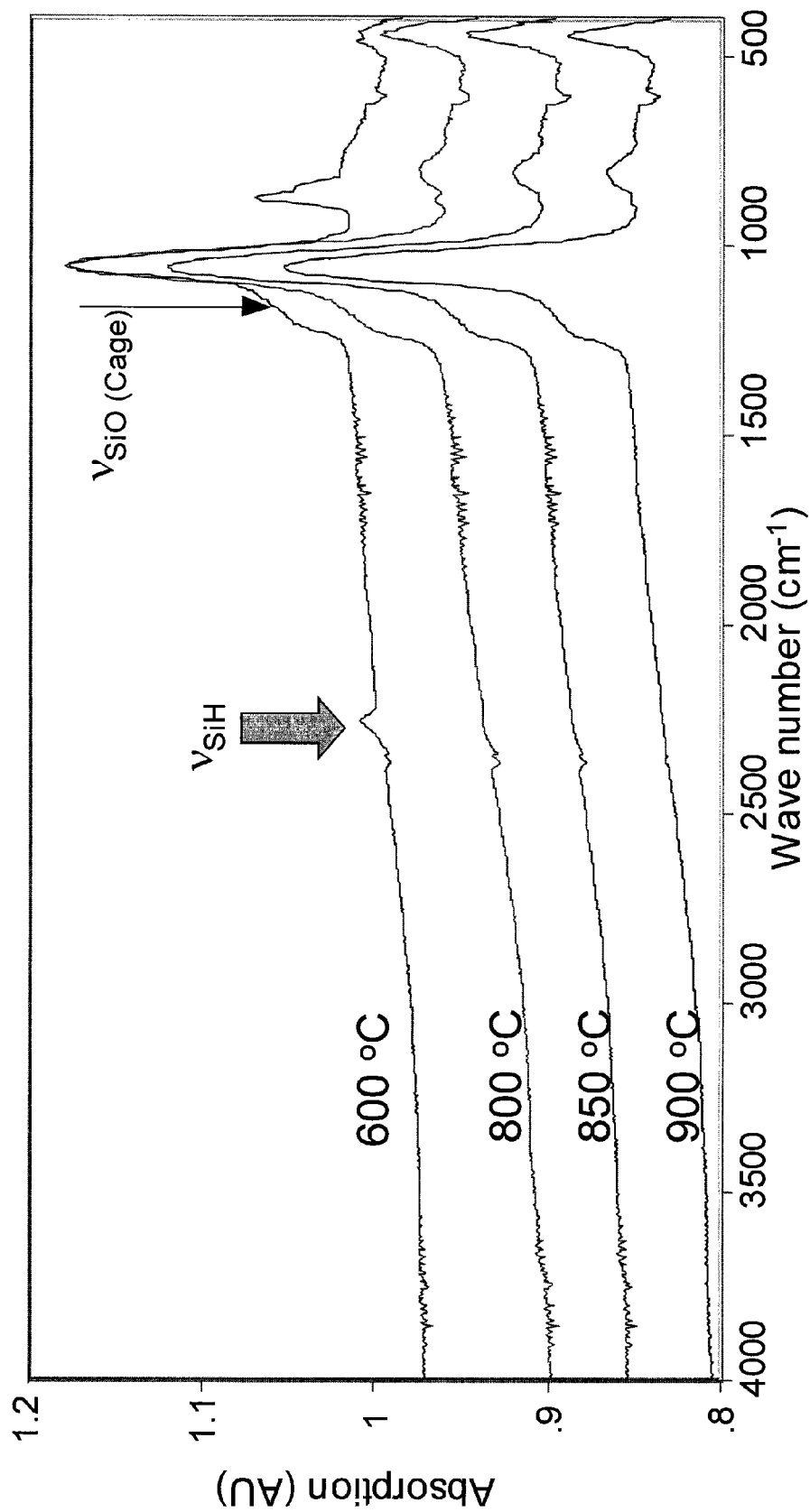
FIG. 6 is FTIR spectra comparing the composition of dielectric films formed by methods of the present invention using various anneal temperatures.

FIG. 6 shows FTIR spectra of dielectric films formed by deposition of flowable films and subsequent thermal cure. Spectra of films cured at 600 C, 800 C, 850 C and 900 C for 60 min are shown. Si—H and cage-like Si—O peaks are indicated on the figure. As can be seen, a small Si—H peak is present at 600 C. Higher temperatures (at or above about 850 C) lead to a complete conversion of Si—H to Si—O. The higher temperature cure also leads to transformation of the cage-like Si—O to branch-like structures, which results in a thermal oxide like films.

Example 3

Multi-Stage Anneal

A single stage 60 min anneal (600 C in air) was compared to multi-stage (60 min/600 C in air followed by 900 C vacuum) anneal. The film resulting from the multi-stage cure was observed to be more etch resistant towards 6:1 BOE (buffered HF etching) solution. In general, the denser the film is, the lower the film wet etch rate (WER) is. Typically, a small wafer with the film is immersed in the 6:1 BOE solution for a period of 10 seconds. The differences in film thickness (measured by any available Opti-probe or ellipsometry techniques) divided by the wet etch time (10 sec) provides the wet etch rate (WER) of a given film in the 6:1 BOE solution. A small piece of the single stage cured (600° C. in air) film subjected to immersion in 6:1 BOE for 10s exhibited a WER of 306 nm/min whereas the multi-stage cured sample (600° C. in air followed by 900° C. in vacuum) exhibited a much slower WER of 230 nm/min film. This indicates that the multi-stage anneal results in denser films.

Example 4

Example Deposition Process

FIG. 7 shows an example of a deposition process. The operations shown in the example process of FIG. 7 include a pre-heat/helium soak at 10 Torr from 15-300 seconds. The wafer then undergoes a steam soak at 9.5 Torr for 30 seconds. $H_2O$ flow is then reduced and TriMos introduced to begin deposition at 4 Torr. Pressure remains at 4 Torr for 20 seconds, before ramping up to 50 Torr. Deposition continues for about another 20 seconds, at which point the gas flows are stopped and the chamber is pumped down for wafer transfer.

While this invention has been described in terms of a few preferred embodiments, it should not be limited to the specifics presented above. Many variations on the above-described preferred embodiments, may be employed. Therefore, the invention should be broadly interpreted with reference to the following claims.

The invention claimed is:

1. A method of filling a gap on a substrate with a dielectric film comprising:
   a) providing a substrate having a gap to a reaction chamber;
   b) introducing process gases comprising a silicon-containing precursor, an oxidant and a catalyst compound to the reaction chamber;
   c) exposing the substrate to the process gas under conditions such that a condensed flowable film forms on the substrate surface and at least partially fills the gap; and further comprising treating the substrate with steam prior to the introduction of the silicon-containing precursor.

2. The method according to claim 1 further comprising
   d) converting the flowable film to a solid dielectric film.

3. The method according to claim 1 wherein the catalyst compound is selected from a halogen-containing compound and an onium compound.

4. The method of claim 1 wherein the catalyst compound is a silicon-containing compound.

5. The method of claim 1 wherein (b) comprises introducing a silicon-containing precursor flow and an oxidant flow into the chamber via separate inlets.

6. The method of claim 1 wherein the catalyst compound is pre-mixed or incorporated into the silicon-containing precursor flow and/or the oxidant flow.

7. The method of claim 1 wherein the silicon-containing precursor and oxidant flows are introduced via liquid injectors.

8. The method of claim 1 wherein the silicon-containing precursor is selected from tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), triphenylethoxysilane, 1-(triethoxysilyl)-2-(diethoxymethylsilyl)ethane, tri-t-butoxylsilanol and tetramethoxy silane.

9. The method of claim 1 wherein the silicon-containing precursor is

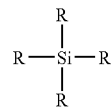

wherein at least 2 of the R groups are independently $C_1$-$C_5$ alkoxy groups (or other organic groups that can be readily cleaved from silicon at temperatures near room temperature by hydrolysis), and the balance, if any, are independently selected from the group consisting of hydrogen, alkyl, alkenyl, alkynyl, substituted and unsubstituted phenyl, halogen and amine.

10. The method of claim 1 wherein the oxidant is selected from water (steam), ozone and a peroxide.

11. The method of claim 1 wherein the oxidant is a non-peroxide oxidant.

12. The method of claim 1 wherein the deposition reaction occurs in non-plasma conditions.

13. The method according to claim 2 further comprising:
   e) repeating operations (b)-(d) at least once.

14. The method of claim 2 wherein (d) comprises a multi-stage anneal, with one or more of a thermal, ultraviolet (UV), electron-beam (E-beam), microwave, laser or plasma anneal used at each stage.

15. The method of claim 3 wherein the catalyst is selected from $Cl^-$, $Br^-$ and $Fl^-$.

16. The method of claim 3 wherein the catalyst is selected from substituted or unsubstituted onium cations.

17. The method of claim 7 wherein the catalyst compound is selected from $(CH_3O)_3SiX$, $(CH_3CH_2O)_3SiX$, $(CH_3O)_2Si(H)X$, $(CH_3CH_2O)_2Si(H)X$ and $(CH_3)_3SiN(H)Si(CH_3)_3$, $HSiX_3$ or $SiX_4$ wherein X is a halogen.

18. The method of claim 5 wherein (b) further comprises introducing a separate catalyst compound flow into the reactor.

19. The method of claim 6 wherein the catalyst and silicon-containing precursor flow comprises a silicon-containing precursor having between about 0.01-2% halogen impurity.

20. The method of claim 6 wherein the oxidant and catalyst flow is an onium hydroxide flow.

21. A method of lining or filling a gap on a substrate with a dielectric film comprising:
   a) providing a substrate having a gap to a reaction chamber;
   b) forming a flowable film comprising Si—H and Si—OH bonds on the substrate;
   c) converting the flowable film to a solid dielectric film by an anneal process that comprises:
      i) performing a first anneal at a first temperature to convert at least some of the Si—H bonds to Si—O and Si—OH bonds, wherein the first temperature ranges between about 200° C. to 600° C.; and
      ii) performing a second anneal at a second temperature to densify the film, wherein said second temperature is greater than the first temperature.

22. A method of lining or filling a gap on a substrate with a dielectric film comprising:
   a) providing a substrate having a gap to a reaction chamber;
   b) forming a flowable film comprising Si—H and Si—OH bonds on the substrate;
   c) converting the flowable film to a solid dielectric film by an anneal process that comprises:

i) performing a first anneal at a first temperature to convert at least some of the Si—H bonds to Si—O and Si—OH bonds; and ii) performing a second anneal at a second temperature to densify the film, wherein said second temperature is greater than the first temperature, and wherein the second temperature ranges between about 600° C. to 1100° C.

23. A method of filling a gap on a substrate with a dielectric film comprising:

a) providing a substrate having a gap to a reaction chamber;

b) introducing process gases comprising a silicon-containing precursor, an oxidant and a catalyst compound to the reaction chamber; and c) exposing the substrate to the process gas under conditions such that a condensed flowable film forms on the substrate surface and at least partially fills the gap, wherein the oxidant is selected from water (steam), ozone and a peroxide.

* * * * *